(12) United States Patent
Lee et al.

(10) Patent No.: US 7,512,390 B2
(45) Date of Patent: Mar. 31, 2009

(54) SYSTEM AND METHOD FOR TUNING A FREQUENCY GENERATOR USING AN LC OSCILLATOR

(75) Inventors: Kang Yoon Lee, Seoul (KR); Yido Koo, Seoul (KR); Jeong-Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 386 days.

(21) Appl. No.: 11/057,414

(22) Filed: Feb. 15, 2005

(65) Prior Publication Data

US 2006/0003720 A1    Jan. 5, 2006

Related U.S. Application Data

(60) Provisional application No. 60/545,933, filed on Feb. 20, 2004.

(51) Int. Cl.
*H04B 7/00* (2006.01)
*H04B 1/181* (2006.01)

(52) U.S. Cl. .................... 455/260; 455/180.3; 455/264

(58) Field of Classification Search ............. 455/260, 455/264, 262, 258, 259, 180.3, 180.4; 327/156, 327/157
See application file for complete search history.

(56) References Cited

U.S. PATENT DOCUMENTS

| 5,220,294 | A  | * | 6/1993  | Ichikawa ................ 331/17 |
| 6,137,372 | A  |   | 10/2000 | Welland ................ 331/117 |
| 6,281,758 | B1 |   | 8/2001  | Elsayed et al. |
| 6,285,865 | B1 | * | 9/2001  | Vorenkamp et al. ......... 455/307 |
| 6,591,091 | B1 | * | 7/2003  | Vorenkamp et al. ...... 455/179.1 |
| 6,815,988 | B2 | * | 11/2004 | Sanduleanu ................ 327/157 |
| 6,876,266 | B2 | * | 4/2005  | Koo et al. ................ 331/117 R |
| 6,963,248 | B2 | * | 11/2005 | Ward et al. ................... 331/18 |
| 6,975,175 | B2 | * | 12/2005 | Sanduleanu ................. 331/16 |
| 7,042,253 | B2 | * | 5/2006  | Su et al. ........................ 327/17 |
| 7,102,446 | B1 | * | 9/2006  | Lee et al. ..................... 331/11 |
| 7,138,839 | B2 | * | 11/2006 | Zachan et al. ............... 327/157 |

(Continued)

OTHER PUBLICATIONS

A CMOS Self-Calibrating Frequency Synthesizer, Wilson et al., IEEE Journal of solid-state circuits, vol. 35, No. 10, 2000, pp. 1437-1444.

*Primary Examiner*—Sonny Trinh

(57) ABSTRACT

An LC-VCO includes a multivibrator which outputs a frequency signal, a fine tuning circuit which tunes the frequency signal by a first amount, a coarse tuning circuit which tunes the frequency signal by a second amount, and a control circuit which controls the fine and coarse tuning circuits. The coarse tuning circuit is formed from one or more capacitive arrays and the fine tuning circuit is formed from one or more varactors. The capacitive arrays are preferably controlled by a digital signal, where each bit selectively couples a respective capacitor to the multivibrator. An analog signal controls the value of the varactors. The capacitive arrays and varactors charge and discharge an inducator in the multivibrator to tune the frequency signal. The VCO may be incorporated within a phase-locked loop, where the capacitors may be assigned different weight and/or redundancy values to tune an output frequency signal. In one embodiment, coarse tuning and lead-lag detection is performed more accurately to allow the size of the varactors to become significantly reduced compared with other circuits which have been proposed.

48 Claims, 9 Drawing Sheets

U.S. PATENT DOCUMENTS

| | | | |
|---|---|---|---|
| 7,256,629 B2 * | 8/2007 | Zachan et al. | 327/156 |
| 7,382,199 B2 * | 6/2008 | Talwalkar | 331/16 |
| 2002/0113659 A1 | 8/2002 | Scoggins | |
| 2003/0202313 A1 | 10/2003 | Hsu et al. | |
| 2003/0210101 A1 | 11/2003 | McCorquodale et al. | |
| 2004/0114302 A1 | 6/2004 | Maget | |
| 2004/0150485 A1 | 8/2004 | Muramatsu | |
| 2004/0169564 A1 | 9/2004 | Muramatsu | |
| 2004/0251978 A1 | 12/2004 | Muramatsu et al. | |
| 2005/0212605 A1 * | 9/2005 | Puma | 331/16 |

* cited by examiner

SYSTEM AND METHOD FOR TUNING A FREQUENCY GENERATOR USING AN LC OSCILLATOR

CROSS-REFERENCE TO RELATED APPLICATIONS

This application claims benefit to U.S. Provisional Patent Application Ser. No. 60/545,933, filed on Feb. 20, 2004, the contents of which are incorporated herein by reference.

BACKGROUND OF THE INVENTION

1. Field of the Invention

The present invention generally relates to generating frequency signals, and more particularly to a system and method for controlling a frequency signal generator such as a phase lock loop.

2. Background of the Related Art

Phase locked loops (PLLs) are used in many wireless systems to perform digital clock synchronization, frequency synthesizing, and other functions. FIG. 1 shows a PLL which has been used in communication systems. This PLL includes a phase/frequency detector (PFD) 102, a charge pump and loop filter 104, a voltage-controlled oscillator (VCO) 106, and an optional frequency divider 108 situated along a feedback loop between the VCO and PFD.

In operation, the PFD compares phases or frequencies of input and output signals and then generates an UP or DOWN signal. If the comparison indicates the input signal is leading the output signal, the DOWN signal is generated. Conversely, the UP signal is generated if the input signal is lagging the output signal. Using the signal output from the PFD, the charge pump and loop filter generate a control signal $V_{control}$ for setting the output frequency of the VCO. This output frequency is then divided and fed back into the PFD for subsequent comparisons with the input signal. Through this feedback loop, the PLL is therefore able to "lock on" to a desired output frequency.

In many PLL applications, inductor-capacitor VCOs (LC-VCOs) are used because of their ability to demonstrate improved jitter/phase noise performance compared with other VCOs such as ring oscillators. To maintain a desired level of performance, LC-VCOs must be tuned to account for process variations that produce tolerances for the inductor and capacitor and to cover a required frequency range.

FIG. 2 shows one type of LC-VCO which has been proposed. This VCO includes two cross-coupled CMOS inverters. The first inverter is formed from PMOS transistor 202 and NMOS transistor 204, and the second inverter is formed from PMOS transistor 206 and NMOS transistor 208. The inverters are cross-coupled by connecting the common drain of the first inverter to the common gate of the second inverter and vice versa. The cross-coupled inverters thus form a multivibrator circuit.

The VCO also includes an LC circuit connected between the common drains A and B of the inverters. The LC circuit includes an inductor 210 connected in parallel to two varactors 211 and 212. Each varactor behaves as a reverse-biased diode having a junction capacitance which varies according to an applied voltage. When connected to the cross-coupled inverters, the resulting circuit forms an a stable multivibrator or a free running oscillator, where the free running frequency of the oscillator is the resonant frequency of the parallel LC circuit.

When it is desired to adjust the frequency of the oscillator, the two varactors are connected to the inductor to form an external or on-chip tank circuit 215. When a control voltage $V_c$ is applied to the common cathode of the varactors, the dc voltage across the varactors changes. This causes the capacitance of the varactors to change and proportionally the output frequency of the oscillator. The oscillator frequency may be output from either of nodes A or B.

The FIG. 2 circuit has a number of drawbacks which limit performance. For example, while the varactors may be used to adjust the output frequency of the VCO, the adjustments tend to be slow, inaccurate, and one-dimensional. This, in turn, prevents a phase-locked loop incorporating the circuit from achieving fast-lock times. Also, the varactors in FIG. 2 are relatively large in size, which significantly diminishes the ability to reduce phase noise in the circuit.

In view of the foregoing, it is apparent that a need exists for a system and method for adjusting the output frequency of a voltage-controlled oscillator with greater speed and accuracy than other methods which have been proposed, and which achieves this improved accuracy while simultaneously providing multiple levels of frequency adjustment. There is also a need for a frequency generator (e.g., a phase-locked loop) which achieves faster lock times through the use of smaller-sized varactors which promote phase noise reduction as well as other performance improvements.

SUMMARY OF THE INVENTION

An object of the present invention is to solve at least one of the drawbacks mentioned above and/or to achieve one or more of the advantages described herein.

Another object of the present invention is to provide an improved system and method for controlling the output of a frequency generator.

Another object of the present invention is to control the output frequency of a phase-locked loop in a way that is faster than other methods which have been proposed.

Another object of the present invention is to control the output frequency of a phase-locked loop with greater accuracy than other methods which have been proposed.

Another object of the present invention is to achieve the aforementioned object by providing multiple levels of adjustment which includes at least a coarse tuning adjustment and a fine tuning adjustment.

Another object of the present invention is to achieve the aforementioned object using an LC-VCO having a first capacitive circuit which performs coarse tuning and a second varactor-based capacitive circuit which performs fine tuning of the output frequency of the PLL.

Another object of the present invention is to achieve the aforementioned objects using one or more varactors that are smaller in size and have a better quality factor than varactors used in other LC-VCOs which have been proposed.

Another object of the present invention is to achieve the aforementioned objects using one or more capacitive arrays that perform very accurate coarse tuning, which, in turn, allows the smaller-size varactors to be used for fine tuning.

Another object of the present invention is to provide a PLL which has improved phase noise performance compared with other circuits which have been proposed.

These and other objects and advantages are achieved in accordance with one embodiment by providing redundancy in a weighted capacitor array and then performing a variable-bit comparison time rather than a fixed one. According to this technique, the bit comparison time may be scaled inversely to the amount of redundancy of corresponding weighted capacitors in a capacitor array of the LC oscillator.

The present invention thus reduces the total bit-comparison time of a coarse tuning period. Also, the trade-off between coarse tuning time and the accuracy of coarse tuning may be optimally resolved by adopting a weighted comparison time for coarse tuning of each bit decision. The bit-comparison time for each coarse tuning bit can be set differently according to the comparison resolution.

In accordance with one embodiment, the present invention provides an LC-VCO, comprising a multivibrator which outputs a frequency signal, a first tuning circuit which tunes the frequency signal by a first amount, a second tuning circuit which tunes the frequency signal by a second amount which is less than said first amount; and a control circuit which controls the first and second tuning circuits to tune the frequency signal by said first and second amounts. The multivibrator includes a first inverter circuit including a first node, a second inverter circuit including a second node and being cross-coupled to the first inverter circuit; and an inductor coupled between the first and second nodes, wherein the first and second tuning circuits charge and discharge the inductor to tune the frequency signal.

The first tuning circuit includes a first array of capacitors selectively coupled to the first node of the multivibrator, a second array of capacitors selectively coupled to the second node of the multivibrator which outputs the frequency signal tuned by the first and second tuning circuits, a first array of switches coupled to the first array of capacitors respectively, and a second array of switches coupled to the second array of capacitors respectively. The control circuit controls the first array of switches to selectively couple the first array of capacitors to the first node of the multivibrator, and controls the second array of switches to selectively couple the second array of capacitors to the second node of the multivibrator, to tune the frequency signal.

In accordance with another embodiment, the present invention provides a phase-locked loop circuit which includes a detector, a charge pump coupled to the detector, a low-pass filter coupled to the charge pump to generate a first control signal, a controller to generate a second control signal based on a reference value, a first tuner which generates a first tuning signal based on the first control signal, a second tuner which generates a second tuning signal based on the second control signal, and a voltage-controlled oscillator which generates a frequency signal based on the first and second tuning signals, wherein first and second tuning signals tune the frequency signal by different amounts. Preferably, the first tuning signal tunes the frequency signal by a first amount and the second tuning signal tunes the second frequency signal by a second amount which is greater than the first amount.

In accordance with another embodiment, the present invention provides a phase-locked loop circuit, comprising a voltage-controlled oscillator for generating a frequency signal, a digital comparator which compares the frequency signal to a reference signal, a first controller which generates a first control signal based on a comparator output, a first tuning circuit which forms a first tuning signal based on the first control signal, a bias generator which generates a second control signal, and a second tuning circuit which forms a second tuning signal based on the second control signal, wherein the first and second tuning signals are used by the voltage-controlled oscillator to tune the frequency signal by different amounts.

DETAILED DESCRIPTION OF PREFERRED EMBODIMENTS

Figure 3:
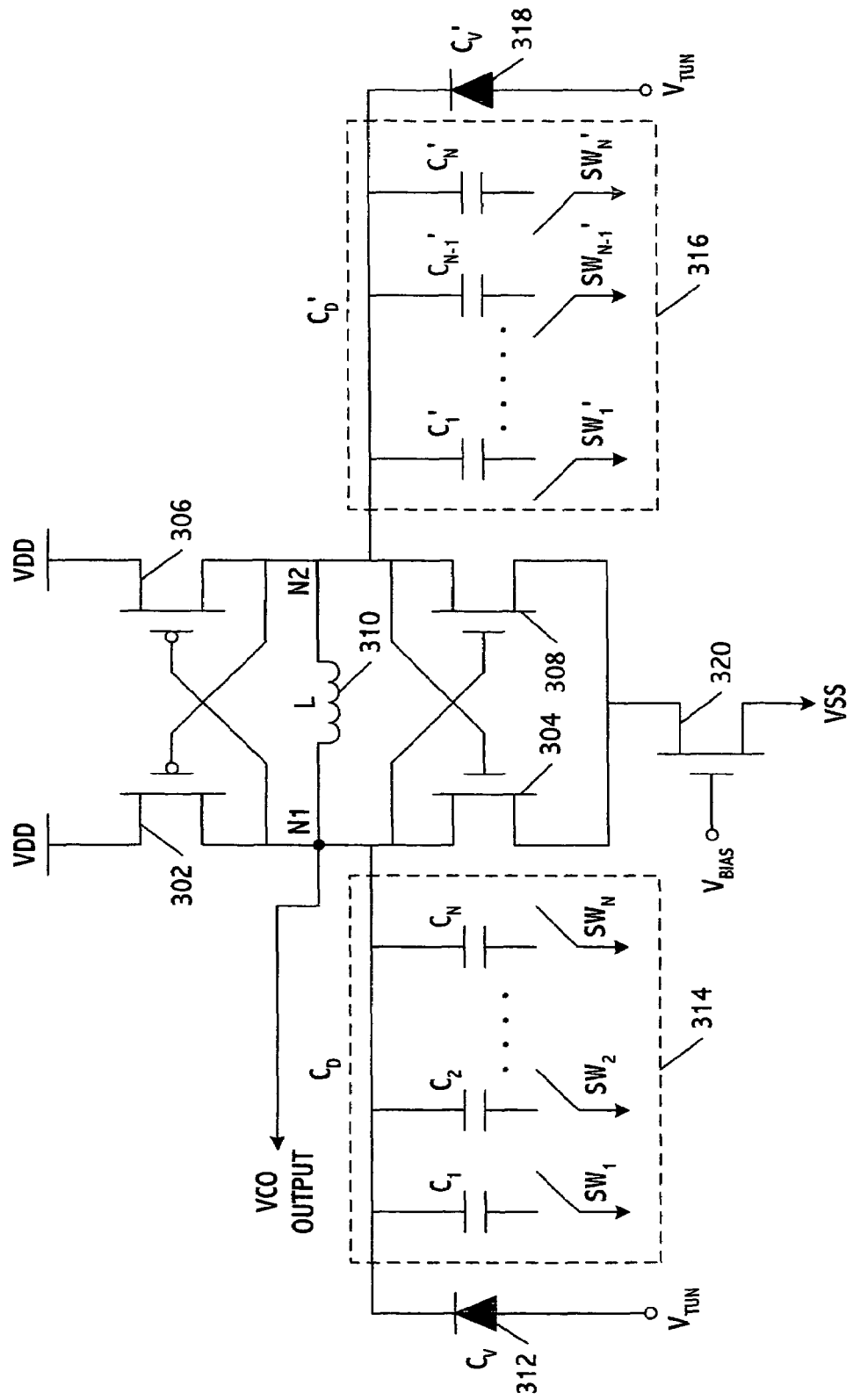
FIG. 3 is a diagram showing an LC-VCO having weighted capacitor arrays in accordance with one embodiment of the present invention.

FIG. 3 shows an LC-VCO which includes two cross-coupled CMOS inverters, an inductor, and two capacitive circuits which are connected in parallel to the inductor. The first inverter is formed from PMOS transistor 302 and NMOS transistor 304, and the second inverter is formed from PMOS transistor 306 and NMOS transistor 308. The inverters are cross-coupled by connecting the common drain of the first inverter to the common gate of the second inverter and vice versa. The inverters thus form a multivibrator. The inductor 310 (L) is connected to the inverters and the capacitive circuits at nodes N1 and N2, either of which may be used to supply the output frequency of the VCO. For illustrative purposes, N1 is shown as supplying the output frequency.

Figure 1:
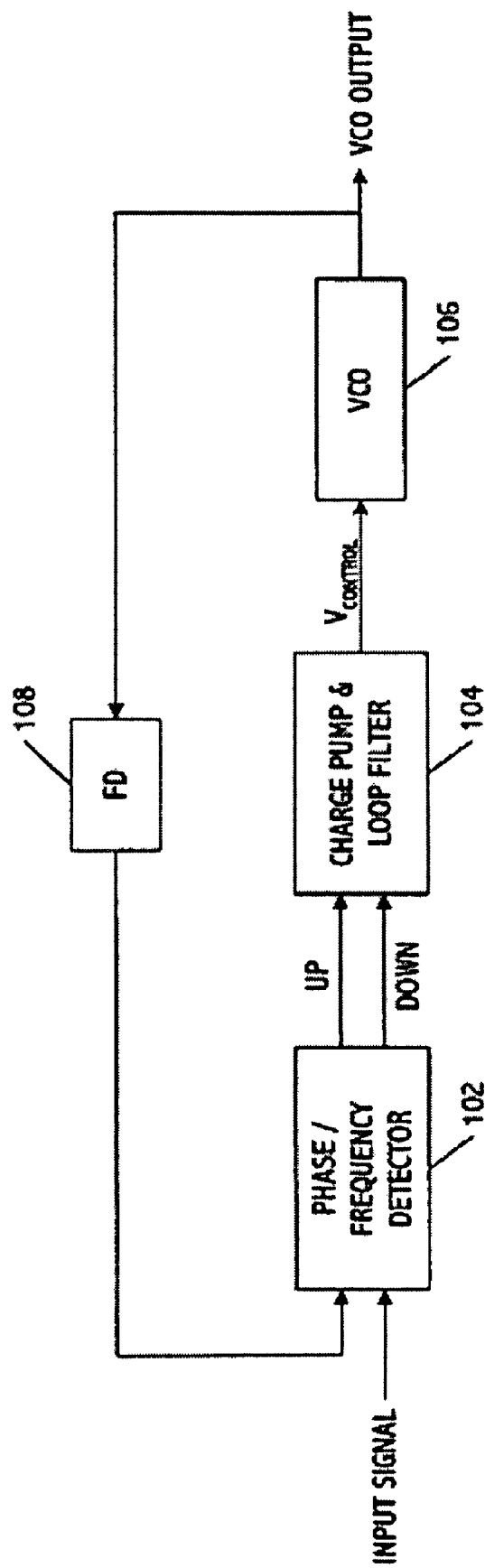
FIG. 1 is a diagram showing a phase-locked loop circuit.
Figure 2:
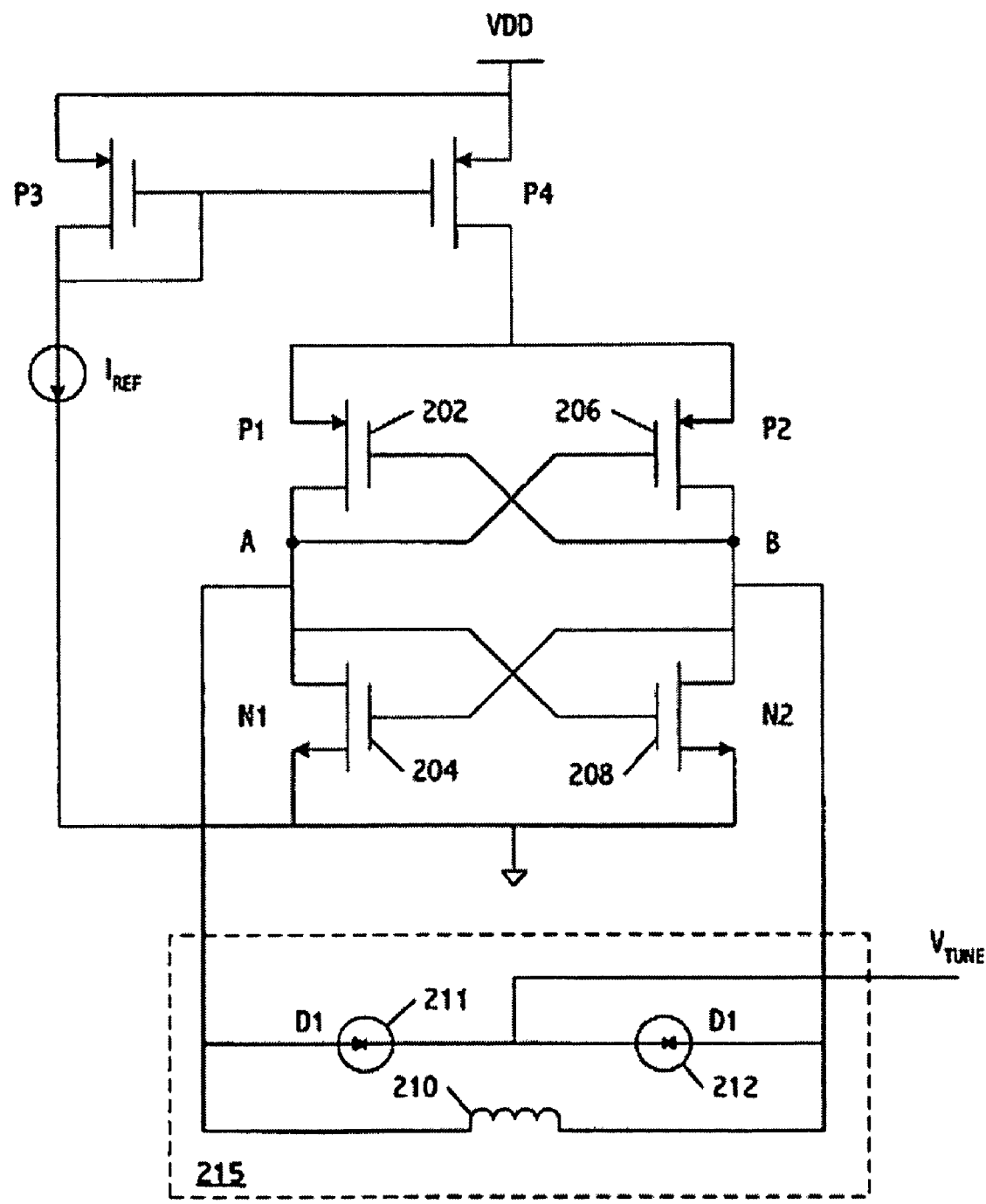
FIG. 2 is a diagram showing one type of voltage-controlled oscillator which has been proposed, which oscillator includes two cross-coupled inverters, varactors, and an inductor.

The first capacitive circuit fine tunes the output frequency of the VCO using two analog varactors ($C_v$, $C_v'$) 312 and 318. The second capacitive circuit performs coarse tuning and includes two discrete capacitor arrays ($C_D$, $C_D'$) 314 and 316 connected to respective sides of the circuit at inductor nodes, i.e., array 314 is connected to the first inverter at node N1 and array 316 is connected to the second inverter at node N2. The varactors are connected to the inductor through the capacitor arrays as shown. Transistor 320 is optionally included for biasing the circuit based on a voltage signal $V_{bias}$. A VCO of this type is suitable for use in wireless and other applications because it provides better phase noise performance than the FIG. 2 circuit, which only provides fine-tuning (e.g., varactor-controlled) of the VCO output frequency.

Figure 4:
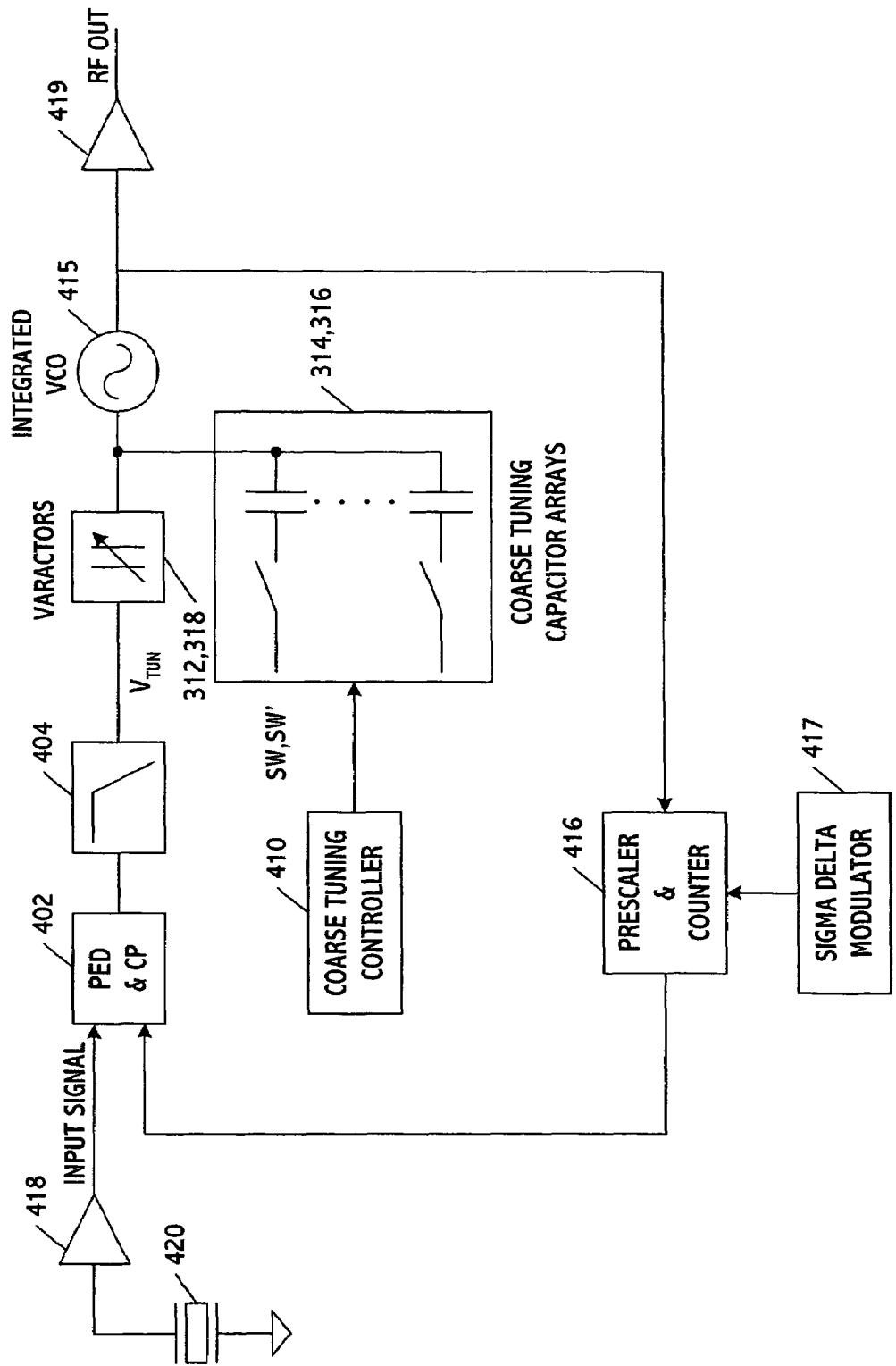
FIG. 4 is a diagram showing a phase-locked loop which includes the LC-VCO of FIG. 3 during a normal tracking mode of operation.

FIG. 4 shows how a PLL may be constructed based on the LC-VCO of FIG. 3 during a normal tracking mode of operation. During this mode, the phase and frequency detector and charge pump (collectively shown as 402) output through a low pass filter 404 a signal $V_{tun}$ for setting the capacitance of analog varactors 312 and 318 and thus the output frequency and phase of the VCO. During this time, capacitors $C_1$-$C_N$ in array 314 are disconnected from node N1 by switches $SW_1$-$SW_N$ and $C_1'$-$C_N'$ in array 316 are disconnected from node N2 by switches $SW_1'$-$SW_N'$. (Any number of capacitors and switches may be included the arrays (e.g., N≧1), and if desired the number of capacitors and switches in the array 314 may be different from the number of capacitors and switches in array 316).

When the PLL is activated or when the output frequency needs to be changed or otherwise adjusted, a coarse tuning period is initiated. Coarse frequency acquisition is performed using controller 410, which generates switching signals for selectively turning on and off capacitors in arrays 314 and 316 to tune the output frequency of VCO 415 to a value which equals or is as close as possible within given tolerances to the desired frequency. In the feedback loop, the VCO output frequency may be divided by prescalar and counter circuits 416 based on control signals generated from a sigma-delta modulator 417. If desired, amplifiers 418 and 419 may be included for amplifying the input and output signals of the PLL, and a crystal oscillator 420 may be used to generate the input signal.

Figure 5:
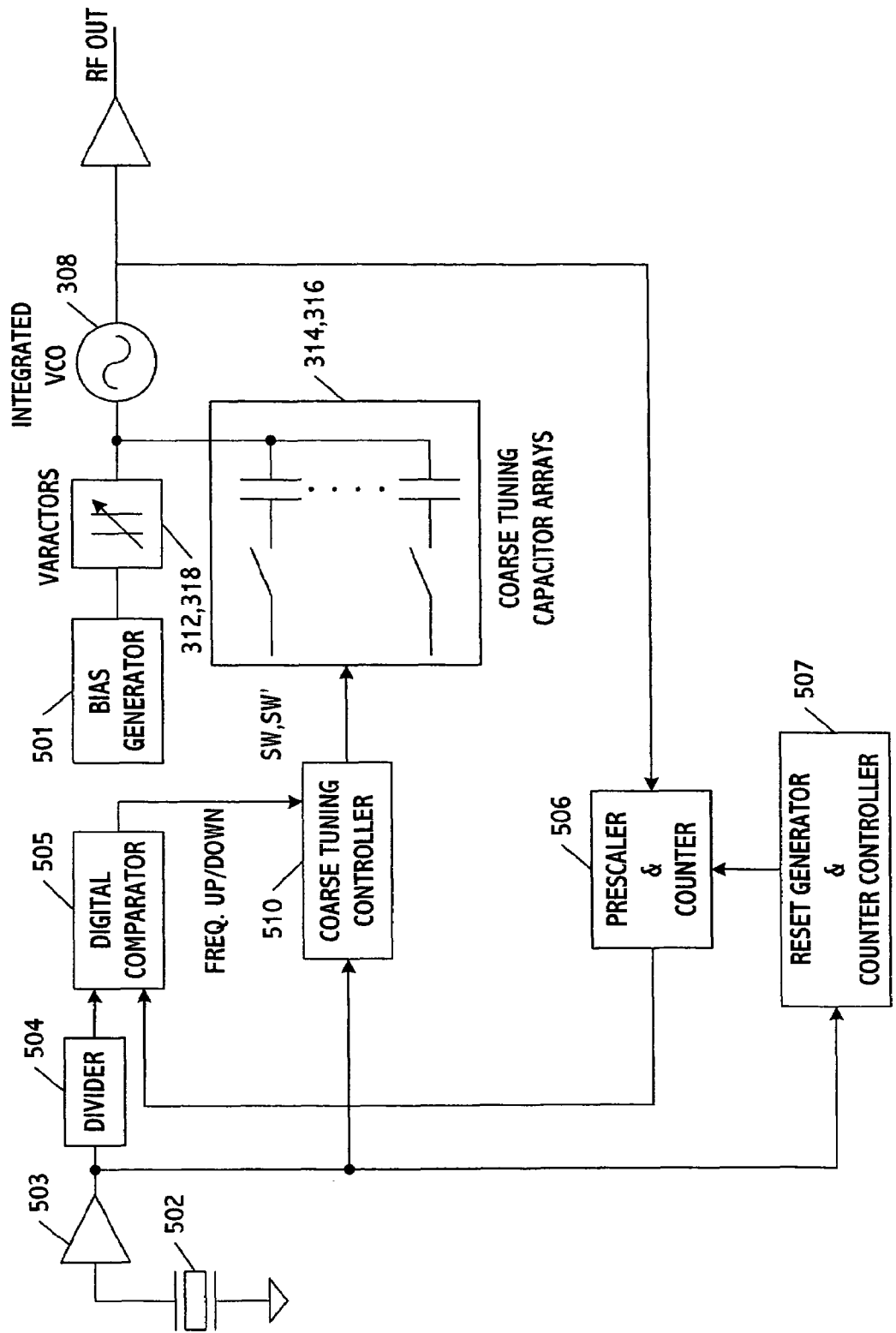
FIG. 5 is a diagram showing a phase-locked loop which includes the LC-VCO of FIG. 3 during coarse tuning period.

FIG. 5 shows another PLL which may be constructed based on the LC-VCO of FIG. 3 during a coarse tuning mode of operation. Before or during this mode, a fine tuning process is performed where bias generator 501 outputs a fixed control voltage $V_{tun}$ to set the capacitances of the varactors (Cv, and $C_v'$) 312 and 318 to fixed values. These fixed values are preferably maintained throughout the coarse tuning phase. During coarse tuning, the VCO output frequency is adjusted by the arrays of discrete tuning capacitors as follows.

The coarse tuning process starts whenever an adjustment in the VCO frequency is required or after power-up. Initially, a crystal oscillator 502 supplies an input reference signal through an optional amplifier 503 and divider 504, and the result is input into a digital comparator 505. During this time, reset generator and counter controller circuits 507 outputs a control signal for resetting the count value of counter 506 based on assertion of the input reference signal. Counter 506 then counts the number of clock cycles that occur in the VCO output over a pre-determined duration, which, for example, may be the time required to achieve the desired lock frequency. This duration may be considered a high duration of the counter value, EN_COUNTER, of the counter.

Digital comparator 505 compares the reference number (e.g., number of cycles in the input reference signal) and the value output from the counter and generates an Up or Down signal to determine whether the VCO frequency is higher or lower than the desired frequency. The prescalar and counter 506 may perform the function of counting the number of clock cycles in the input reference signal, or if desired another circuit may be used.

The coarse tuning controller 510 then generates switching signals for selectively connecting a combination of the capacitors in each array 314 and 316 that will coarsely tune the VCO frequency to the desired value. This may be accomplished as follows. If the Up signal is high, the controller turns off a number of capacitors in arrays 314 and 315 to increase the VCO output frequency. This may be performed iteratively and in stepwise fashion until the difference between the output frequency and reference value is reduced or eliminated. Alternatively, since the capacitance of each capacitor is known, the controller may compute the number of capacitors to turn off and then simultaneously issue signals to switch them off.

If the Down signal is high, the controller turns on a number of capacitors to decrease the VCO output frequency until the difference between this frequency and the reference frequency is reduced or eliminated. This also may be performed in a simultaneous or iterative-stepwise manner. Preferably, the controller turns on/off the same number or capacitors in each array to achieve balance. Coarse tuning may be completed when a combination of capacitors is connected that either causes the VCO output frequency to equal the reference value or reach a value close to the reference value to within a predetermined error as determined by the digital comparator.

The reset generator & counter controller 507 resets the counter value of the prescaler and counter circuit 506 for each coarse tuning stage. At this point, it is noted that other methods have been proposed for performing tuning the output frequency of a VCO. See, e.g., the FIG. 2 circuit previously discussed, U.S. Pat. No. 6,137,372, and the article *A CMOS Self-Calibrating Frequency Synthesizer*, IEEE Journal of solid-state circuits, Vol. 35, No. 10, 2000. In these methods, tuning accuracy is a function of the size of the varactor. The Inventors of the present invention have determined that the size of the varactor is inversely proportional to phase noise, and therefore it would be advantageous to reduce varactor size as a way of improving phase noise performance of the VCO/PLL.

To perform coarse tuning accurately in combination with the fine tuning control provided by the varactors, the present invention performs frequency error detection and controls the step-size of the smallest array capacitor very accurately. Put differently, frequency error detection is minimized or at least compensated for by the present invention to provide accurate coarse tuning. As will become more event below, the design of the frequency error detector is related to coarse tuning time.

Figure 6:
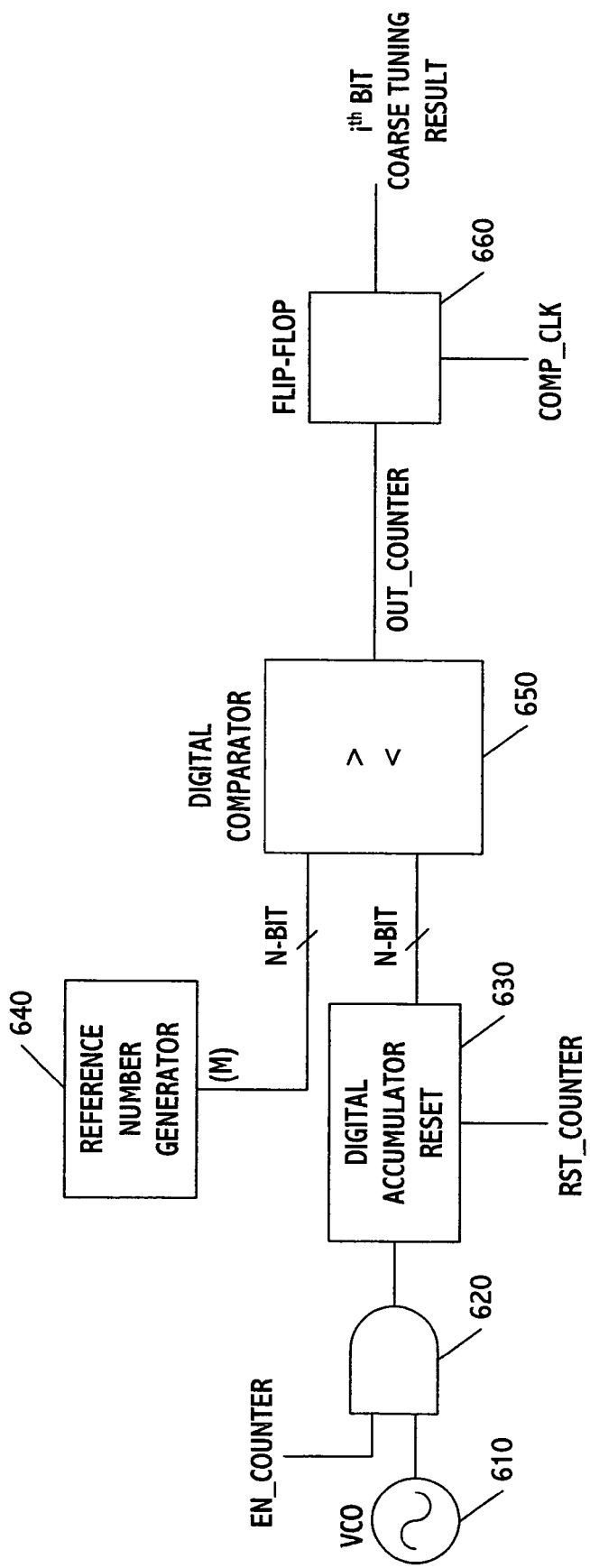
FIG. 6 is a diagram showing one type of lead-and-lag detection logic that may be included in a coarse tuning controller of an LC-VCO according to the present invention.

FIG. 6 shows detection logic for performing coarse tuning, which may start, for example, whenever an adjustment in the VCO output frequency is required or after power-up. Coarse tuning is in essence a form of frequency tracking. Accordingly, a digital accumulator 630 estimates the period of the output of the VCO 610 by performing a count operation, and more specifically by counting the number of oscillations of the VCO output. This estimated count value is compared to a reference count output from reference number generator 640, and the result is used as a basis for generating a coarse tuning signal.

More specifically, during the counting process digital accumulator 630 (operating as a counter) is periodically reset by a RST_COUNTER signal generated by the coarse tuning controller (510 in FIG. 5). The counting operation is initially masked by an EN_COUNTER signal until the appropriate time, and particularly when a high value of EN_COUNTER is input into AND gate 620. When the output of the accumulator/counter 630 exceeds a predetermined reference number M as determined by digital comparator 650, an OUT_COUNTER signal goes high. The OUT_COUNTER signal and a COMP_CLK signal output from the coarse tuning controller are used for lead-and-lag frequency detection using a flip-flop 660.

Figure 7:
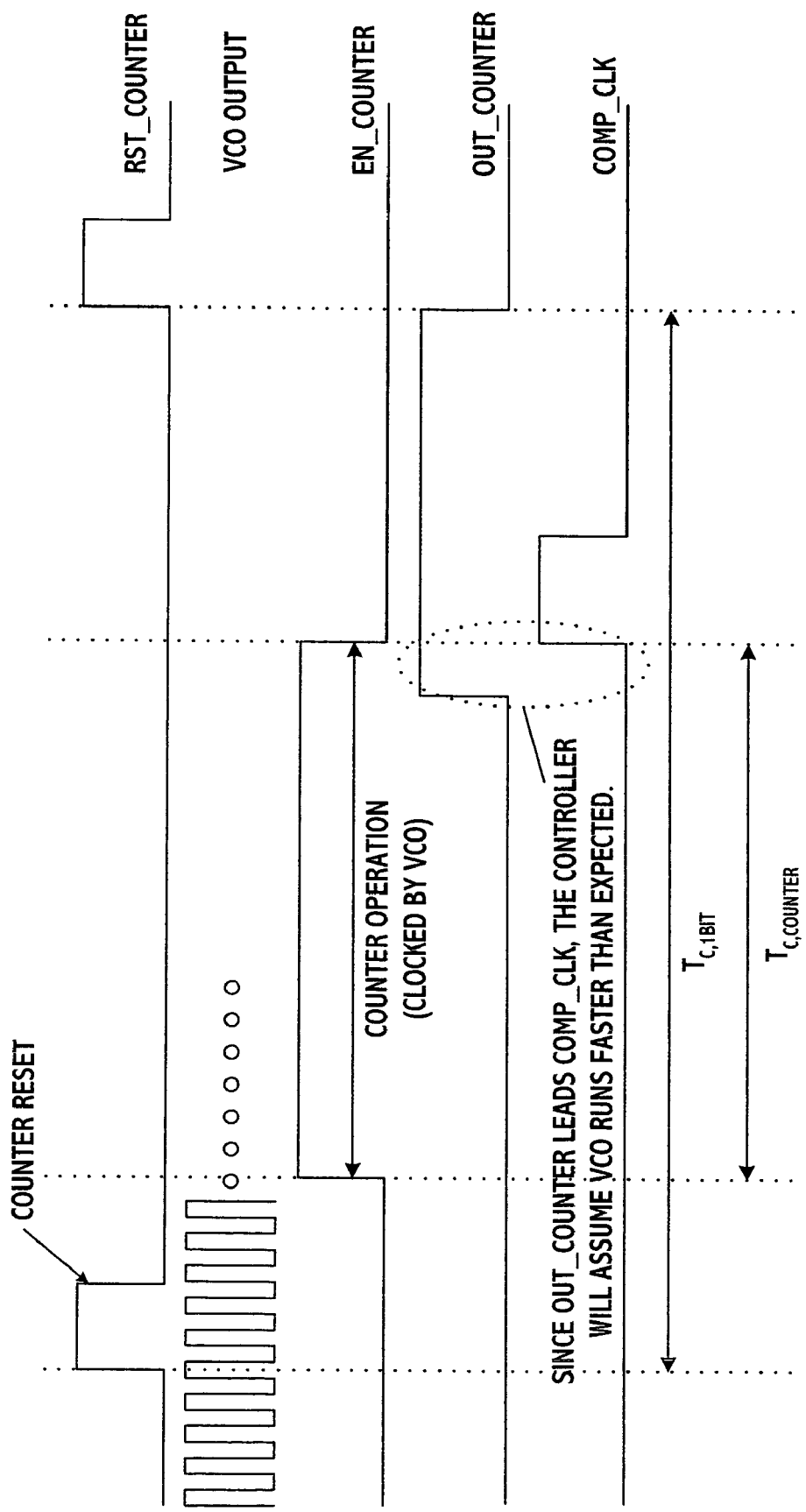
FIG. 7 is a waveform diagram showing one way coarse tuning may be performed in accordance with the present invention when the frequency of the VCO is higher than a reference clock frequency.

FIG. 7 shows a number of timing parameters that may be used to control the coarse tuning process performed by the circuit of FIG. 6. As shown, when the reset counter value RST_COUNTER goes high the digital accumulator (counter) is reset. The accumulator, however, does not start counting the VCO oscillations until the value of EN_COUNTER also goes high. Before this time, the zero logic value of EN_COUNTER masks the VCO output from the accumulator. The period of the reset counter is shown as $T_{C,1\ bit}$ and the period EN_COUNTER is shown as $T_{c,\ counter}$. More specifically, $T_{c,1\ bit}$ corresponds to the total cycle time to switch on and off one bit in the coarse tuning, which is mainly determined by operating time of the counter, $T_{c,counter}$.

In the foregoing description, each bit controls the switching of a respective capacitor in the coarse tuning arrays 314 and 316. A bit value of "0" may open a corresponding switch SW, the effect of which is to disconnect an associated capacitor to a respective one of the cross-coupled inverters. Conversely, a bit value of "1" may close the switch, to thereby connect the capacitor to its cross-coupled inverter. By issuing these bit signals, a number of capacitors in each array may be selectively switched on and off to vary the frequency until a desired output is attained.

When EN_COUNTER goes high, the accumulator begins counting the VCO oscillations. When the digital comparator determines that the count value matches a predetermined value output from the reference number generator, OUT_COUNTER goes high. This value is stored in the flip-flop until it is output as an ith-bit course tuning result by the COMP_CLK control signal. This result is used for lead-and-lag detection of the VCO frequency. During operation, the OUT_COUNTER may lead COMP_CLK. Accordingly, the coarse tuning controller may assume that the VCO runs faster then expected.

More specifically, the OUT_COUNTER signal becomes high prior to a low-to-high transition of the COMP_CLK signal. According to the frequency error, the latched value (i.e., the output of digital comparator 505 in FIG. 5, which is also the output of flip-flop 660 in FIG. 6) will vary from one to zero. This polarity at the latch output is used to determine the polarity of the switch connected to the (i-th) capacitor in the VCO. A more detailed explanation of this operation now follows.

When the PLL receives channel frequency information, the coarse tuning controller converts the channel information to appropriate timing parameters for the coarse tuning. For example, when the desired target frequency is 1 GHz and the external reference clock frequency is 20 MHz, the coarse tuning controller works with this 20 MHz external clock signal to generate RST_COUNTER, EN_COUNTER, the reference number, and COMP_CLK signals.

To illustrate this point further, assume that the high duration of the EN_COUNTER is set as 1 us and the target VCO frequency is 1 GHz. (Here, the "1 us" for the duration of the EN_COUNTER is a design value and can be changed to other value according to the accuracy of the coarse tuning process.) Given these parameters, the external clock may be divided by some value, e.g., 20, to generate the high duration (20/20 MHz=1 us) of the EN_COUNTER signal. The reference number is determined from the division of the EN_COUNTER by the duration of the target VCO frequency. Hence, in this example, the reference number is 1000 (=1 us/(1/1 GHz)). This reference number is compared with the counter value of the prescaler and counter at the digital comparator. The COMP_CLK is synchronized with the falling edge of the EN_COUNTER and used as a timing clock in the digital comparator. The RST_COUNTER is a reset signal for each coarse tuning stage and high during one external clock after the EN_COUNTER goes from high to low. The accuracy of the coarse tuning process is a design parameter to be decided and is mainly determined by the EN_COUNTER signal.

One factor which may limit the accuracy of coarse tuning is the uncertainty of the lead-and-lag detection logic. Assuming the goal of coarse tuning is to discriminate some predetermined frequency difference (e.g., 1 MHz), two VCO frequencies (e.g., 0.9995 GHz and 1.0005 GHz) should be detected. When the duration of the EN_COUNTER is set to 1 µs, the reference number ("M" in FIG. 6) should be set to 1000(=1 µs/1 ns). Time differences between the rising edges of EN_COUNTER and OUT_COUNTER are 1.0005 µs for the VCO frequency of 0.9995 GHz and 0.9995 µs for the VCO frequency of the 1.001 GHz. When no timing uncertainty exists, the former case will produce a frequency DOWN signal and the latter case will produce a frequency UP signal by the lead-and-lag detection logic. However, if a timing uncertainty exists of the lead-and-lag detection logic is 1 ns, the two results can be same. Under these conditions, there is no guarantee that the two VCO frequencies can be distinguished by the lead-and-lag detection logic.

Several techniques may be used to improve the accuracy of coarse tuning. For example, when timing uncertainty is fixed accuracy can be improved by increasing the reference number or the duration of EN_COUNTER. If the reference number is increased by 10 times, time differences will be 10.005 µs and 9.995 µs for those two cases. Since the timing margin of 5 ns is larger than the timing uncertainty of 1 ns, the decision will be correct. In other words, 0.1% of the initial frequency difference of the VCO results in 10 ns of the difference in time rather than 1 ns in former case. Because this value is large enough to compensate for the uncertainty of the lead-and-lag detection logic, the desired accuracy can be obtained.

However, the penalty for improving coarse tuning in this manner is an increase of the comparison time or the time required for coarse tuning. If the number of bits to be determined is 10 bits, the time required to finish coarse tuning will be 10 times for the 1-bit decision case. Thus, as the number of bits or accuracy for coarse tuning increases, coarse tuning time is also increased. This is undesirable for at least the following reasons.

After coarse tuning is finished, the PLL enters into the phase-lock operation. Because the total lock time of the PLL includes the time required to perform coarse tuning, minimizing the coarse tuning time is highly desirable for achieving improved lock-time performance.

Also, as previously indicated, a size reduction of the analog varactor can improve the phase noise performance because the varactor typically has a poor quality factor compared to a discrete capacitor array used for coarse tuning. Increasing the accuracy of coarse tuning in accordance with the present invention therefore allows the size of the varactor to be reduced. This increased accuracy also ensures that the operating range of the varactor will not exceed the operating frequency range, which, in turn, guarantees that phase and frequency lock will occur. In accordance with at least one embodiment of the present invention, coarse tuning is performed very fast in order to achieve good phase noise performance and small lock time.

Figure 8:
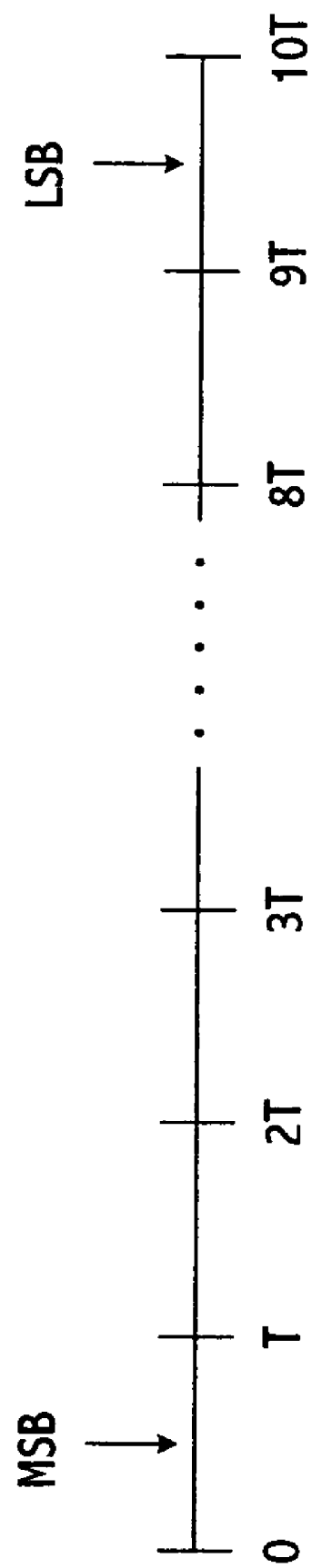
FIG. 8 is a diagram showing a bit-comparison time for each bit and total bit-comparison time in another type of circuit which has been proposed.

FIG. 8 shows a timing diagram of the coarse tuning process performed in FIGS. 6 and 7, where T represents a period of the VCO output frequency. As previously noted, the final resolution of coarse tuning should be small enough to allow a reduction in the size of the varactor. However, the coarse tuning time for each bit is also set large enough to cover all variations in the decision process. Those variations can come from the uncertainty of the lead-and-lag detection logic, other logic delay, noise (e.g., power supply noise), start-up time of the each component, and the like. Accordingly, when the number of the coarse tuning bits increases, the total time required for the coarse tuning increases linearly as illustrated in FIG. 8, which is undesirable. (As previously discussed, these "bits" are the switch control signals for the capacitors in the arrays. MSB is the bit corresponding to capacitor $C_N$ and LSB is the bit corresponding to capacitor $C_1$ with the remaining bits ordered there between).

Figure 9:
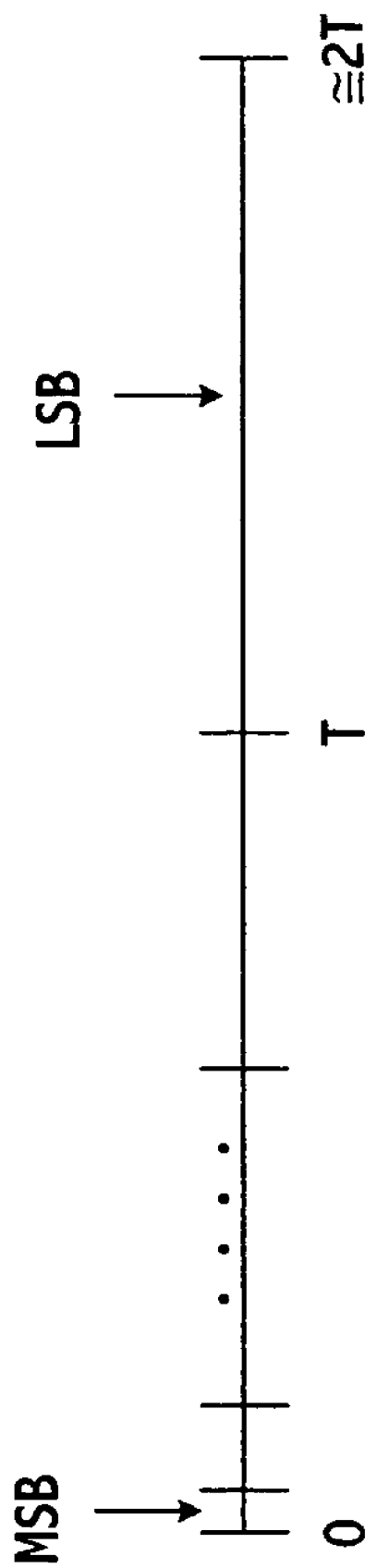
FIG. 9 is a diagram showing a total bit-comparison time in accordance with the present invention which is significantly less than the total bit-comparison time of the circuit in FIG. 8.

FIG. 9 shows a method for performing coarse tuning process according to one embodiment of the present invention. Unlike in FIG. 8, the decision time for each bit can set differently. The last bit (e.g., LSB) has a longer decision time and the first bit (e.g., MSB) has a shorter decision time. If desired, the duration of each bit may be optimized according to a specific implementation of the coarse tuning algorithm. Therefore, weighting the decision time can provide an accurate coarse tuning result while simultaneously reducing coarse tuning time. In accordance with this embodiment, adaptive time regulation may be performed for coarse tuning by incorporating redundant weighting in the discrete capacitor array.

Table 1 shows examples of weighting values that may be used for the capacitor array. In this table, Caps(n) corresponds to the (n-th) capacitor used to tune the frequency of the VCO. For example, Caps(1) is the last capacitor to be selected during the coarse tuning process. Also, in the table only the relative weighting factor for the capacitance value is shown. The weighting factors from Caps(10) to Caps(7) are selected by binary weighting for the wide VCO range, and the weighting factors from Caps(6) to Caps(1) can be empirically selected from the trade-off between coarse tuning time and the redundancy margin. For example, the weighting of Caps (6) is 10 and the sum of the weightings from Caps(5) to Caps(1) is 16. So, there is redundancy amount of 6 in Caps(6) level.

Since the frequency of the LC-VCO may be determined by the equation $1/2\pi\sqrt{LC}$, the relative weighting of the capacitance is sufficient to indicate the variation of the frequency. The redundancy R(i) in the Table 1 can be obtained using the weighting W(i) by equation (1) as follows.

$$R(i) = \max\left\{\left[\sum_{i=1}^{i-1} W(i) - W(i)\right], 0\right\}, \text{ where } i \geq 2 \quad (1)$$

$$R(1) = 0$$

Because the capacitance value corresponds to the frequency, Equation (1) indicates that redundancy can be used to compensate for error in the decision process. For example, R(10) is 10 and thus if the switch for the Caps(10) is selected in a wrong way, this error can be corrected in the following decision process. However, when the polarity of the switch for Caps(10) is set to zero, unexpected error in the decision logic and the amount of the redundancy is negative unlike Table 1.

The coarse tuning process cannot resolve the frequency error caused by this negative redundancy. In an ideal situation, if the decision process is perfect and the redundancies can all be set to zero, the coarse tuning result will also be ideal and the resulting accuracy will be determined by the smallest weighting factor. However, in practical implementations of the capacitor array, some mismatch is likely to exist between two binary-weighted capacitors. If there is no redundancy for the lower bits, this mismatch at a certain stage cannot be resolved.

Because the amount of the mismatch is proportional to the weighting factor, the frequency error caused by the mismatch will be less severe for capacitor arrays with smaller weighting factors. For example, a 10% error for two binary weighted capacitors, 64 and 1, will result in the error of the capacitance, 6.4 and 0.1, respectively. If the final resolution of the tuning capacitor is assumed to be one, a 10% error in the most-significant bit will give too large an error for the frequency calculation. Thus, the redundancy is usually given to high index (e.g., MSB) value rather than the low index as illustrated in Table 1.

TABLE 1

| Capacitor Caps (n) | Weighting W(n) | Redundancy Amount R(n) |
|---|---|---|
| Caps(1) | 1 | 0 |
| Caps(2) | 2 | 0 |
| Caps(3) | 3 | 0 |
| Caps(4) | 4 | 2 |
| Caps(5) | 6 | 4 |
| Caps(6) | 10 | 6 |
| Caps(7) | 16 | 10 |
| Caps(8) | 32 | 10 |
| Caps(9) | 64 | 10 |
| Caps(10) | 128 | 10 |

Although redundancy in an array of capacitors can intentionally be made to compensate for fabrication mismatch of the capacitor array, this property can also be used to reduce the coarse tuning time effectively. Even though some uncertainty or error happens to exist in the decision process of the coarse tuning, those errors or uncertainty will be corrected if amount of the error is smaller than the redundancy amount at that specific index.

For example, assuming that the desired target frequency corresponds to "130" as the sum of the weighted capacitance, the coarse tuning values of Caps(10) and Caps(2) should be set to one (e.g., switched on) in the ideal case. For example, referring to FIG. 6, even though the Caps(10) is set to one, the lead-and-lag detection logic produces the comparison result of "UP". Accordingly, the frequency of the VCO should be increased. In this case, it is assumed that the frequency increases as the number of weighted capacitor increases. Thus, the effective frequency of the VCO with "1" of Caps (10) is slower than the target frequency with "130" of the effective weighting value. If the decision logic has some offset and, for example, that value is "3", then the coarse tuning value for Caps(10) will be one rather than zero. Since the weighting factor given to the capacitor is a factor to determine the operating frequency of the VCO, the offset value is directly expressed as timing error when converted to the time domain from the frequency domain.

For example, if the unit value of "1" corresponds to a period error of 3 ns, then an offset value "3" indicates that the coarse tuning process has a 9 ns offset at its decision. This timing error can be corrected by increasing the comparison time for each bit. Assuming that only the first decision process has decision error for simplicity, the remaining coarse tuning decision will be correct. Thus, Caps(10-1) from the coarse tuning will be [0111101101] to get the total weighted value of 130. Even though the above example is simplified for the decision error, it is clear that the redundancy helps to compensate the decision error at certain stage.

Redundancy in Caps(N) level, where $N \geq 2$, is the difference between the sum of Caps from N-1 to 1 and Caps(N). For example, the target VCO frequency is "13". Let's assume there is a decision error in Caps(6) level and, therefore, Caps (6) is erroneously selected as "0", instead of the correct "1". Because the weighting of the Caps(6) is "10" and selected as "0", the rest of the Caps(i.e. Caps(5-1)) should be selected to cover the target VCO frequency. As a result, Caps, [0000011100], instead of [0000100100] is selected. So, in case there are decision errors, the rest of the stages can cover the error with the help of redundancy.

The amount of the mismatch in two binary-weighted capacitor arrays is typically larger than error sources from the decision logic. Thus, the redundancy value is designed to be able to compensate for the mismatch rather than the error in the decision process of the coarse tuning. Therefore, the timing error during the decision process has less impact on the accuracy of the coarse tuning. Thus, the duration of the coarse tuning can be reduced if there is large redundancy. Since the extension of the duration of the comparison time (e.g., as illustrated in FIG. 7) can reduce the effect from the decision process, the most accurate decision or longest comparison time can be made when the redundancy is zero. In the particular example of Table. 1, the coarse tuning controller should have the most accurate decision when it decides the switching polarity of Caps(3-1) where the redundancy is zero. The comparison accuracy for the other bits can be relaxed and thus smaller comparison time can be allowed.

As stated before, when the comparison time is doubled, the accuracy of the coarse tuning process is typically doubled. Assuming that $T_{min}$ is the minimum 1-bit comparison time required for Caps(1-3), the comparison time for Caps(4) can have the value of $T_{min}/2$ to give correct coarse tuning result. Likewise, the comparison time of $T_{min}/10$ can be used for Caps(10), which will have the same probability of error with that of $T_{min}$ for Caps(1-3). Table 2 shows one example procedure for timing according to the invention.

TABLE 2

| PROCEDURE | OPERATIONS |
|---|---|
| Cycle 12 | Set Cas[10:1] = "01111111111" |
| Cycle 11 | If VCO too slow, set Caps[10] to "1" and set Caps[9] to "0". |
| | If VCO too fast, set Caps[9] to "0". |
| Cycle 10 | If VCO too slow, set Caps[9] to "1" and set Caps[8] to "0". |
| | If VCO too fast, set Caps[8] to "0". |
| Cycle 9 | If VCO too slow, set Caps[8] to "1" and set Caps[7] to "0". |
| | If VCO too fast, set Caps[7] to "0". |
| Cycle 8 | If VCO too slow, set Caps[7] to "1" and set Caps[6] to "0". |
| | If VCO too fast, set Caps[6] to "0". |
| Cycle 7 | If VCO too slow, set Caps[6] to "1" and set Caps[5] to "0". |
| | If VCO too fast, set Caps[5] to "0". |
| Cycle 6 | If VCO too slow, set Caps[5] to "1" and set Caps[4] to "0". |
| | If VCO too fast, set Caps[4] to "0". |
| Cycle 5 | If VCO too slow, set Caps[4] to "1" and set Caps[3] to "0". |
| | If VCO too fast, set Caps[3] to "0". |
| Cycle 4 | If VCO too slow, set Caps[3] to "1" and set Caps[2] to "0". |
| | If VCO too fast, set Caps[2] to "0". |
| Cycle 3 | If VCO too slow, set Caps[2] to "1" and set Caps[1] to "0". |
| | If VCO too fast, set Caps[1] to "0". |
| Cycle 2 | If VCO too slow, set Caps[1] to "1" and set Caps[0] to "0". |
| | If VCO too fast, set Caps[0] to "0". |
| Cycle 1 | If VCO too slow, set Caps[0] to "1". |
| | If VCO too fast, set Caps[0] to "0". |

As illustrated in Table 2, multiple bits are switched in a different way than previously discussed circuits. Caps can be switched from the MSB to LSB in pairs, sequentially. For example, in the first stage. Caps(10) and Caps(9) are selected. In the second stage, Caps(9) and Caps(8) are selected. Coarse tuning time is limited by the longest comparison time between neighboring Caps, Caps(N) and Caps(N−1). In contrast in the related art, Caps(6) and Caps(3) are switched at the same stage, thus, coarse tuning time is limited by the redundancy amount of Caps(3). However, according to the broadwork of the present invention, Caps(6) and Caps(5) are switched at the same stage, thus, coarse tuning time is limited by that of Caps(5), not Caps(3). Accordingly, coarse tuning time can be significantly reduced compared to the related art systems.

If the same comparison cycle time is applied for the coarse tuning, the total time for the coarse tuning will be 10* $T_{min}$. However, when the adaptive optimization for the comparison time is made, the total coarse tuning time will be reduced. For example, the course tuning time of Table 1 is $$\frac{259}{60} T_{min} \left( \text{i.e., } \frac{T_{min}}{10} 4 + \frac{T_{min}}{6} + \frac{T_{min}}{4} + \frac{T_{min}}{2} + T_{min} 3 \right).$$

Thus, the total coarse tuning is reduced by greater than two times with essentially the same accuracy. Accordingly, accurate coarse tuning can be performed by using the adaptive scaling for the comparison time as described in embodiments of the present invention. The accurate coarse tuning also allows for a smaller size of the analog varactor, which improves phase noise performance.

Additionally, the total lock time can be reduced or made consistent across all conditions by employing techniques described with reference to embodiments of the present invention. The coarse tuning process is digital and thus its functionality and the operating time is determined by the initial design. However, the phase lock operation after the coarse tuning is affected by the initial state of the PFD, the amount of the frequency error, and the variation of the loop characteristics. Accurate coarse tuning reduces the frequency error to the target frequency after the coarse tuning, and thus the maximum value of the frequency error can be reduced. Accordingly, the time required to obtain frequency and phase lock can be reduced. Thus, the total lock time can be regulated and reduced over all initial frequency errors by the accurate coarse tuning.

The overhead due to accurate coarse tuning is greatly relaxed due to the adaptation of the comparison time in embodiments of present invention. The overhead for the accurate coarse tuning and increase of number of bits to be decided are nulled by the regulation of the coarse tuning time and the time reduction of the phase lock operation. Accordingly, embodiments of the present invention can reduce the time of coarse tuning in LC-VCOs and thus reduce the lock time of PLLs.

The foregoing description relates to coarse tuning methods and apparatuses for LC oscillators to improve the phase noise performance and to increase the operating range of the LC oscillator. The coarse tuning increases the effective lock time of the PLL and this overhead increases as the desired accuracy of the coarse tuning increases. In embodiments of the present invention, the bit-comparison time is adaptively controlled to provide the smallest coarse tuning time. The redundancy in the weighted capacitor array for the coarse tuning allows for reduced comparison times without sacrificing the accuracy of the coarse tuning. The bit comparison time is scaled according to the amount of the redundancy. Since the redundancy of the weighted capacitor is used to compensate for the mismatch in the capacitance, the use of this property to reduce the coarse tuning is not an additional burden. Further, if the same time limit on the coarse tuning time is used, embodiments of the present invention can increase the accuracy of the coarse tuning. Since accurate coarse tuning can reduce the operating time and the time variation for the phase lock operation, embodiments of the present invention can reduce lock time of PLLs.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

We claim:

1. A phase-locked loop circuit, comprising:
   a detector;
   a charge pump coupled to the detector;
   a low-pass filter coupled to the charge pump to generate a first control signal;
   a controller to generate a second control signal based on a reference value;
   a first tuner which generates a first tuning signal based on the first control signal;
   a second tuner which generates a second tuning signal based on the second control signal; and
   a voltage-controlled oscillator which generates a frequency signal based on the first and second tuning signals, wherein first and second tuning signals tune the frequency signal by different amounts, and wherein the voltage-controlled oscillator includes a multivibrator having:
   a first circuit including a first node;
   a second circuit including a second node and being coupled to the first circuit; and
   an inductor coupled between the first and second nodes, wherein the first and second tuning signals charge and discharge the inductor to tune the frequency signal, which is output from one of the first and second nodes.

2. The phase-locked loop circuit of claim 1, wherein the first tuning signal tunes the frequency signal by a first amount and the second tuning signal tunes the second frequency signal by a second amount which is greater than the first amount.

3. The phase-locked loop circuit of claim 1, wherein the voltage-controlled oscillator includes the multivibrator having:
   a first inverter including the first node;
   a second inverter including the second node and being cross-coupled to the first inverter circuit.

4. The phase-locked loop circuit of claim 3, wherein the second tuner includes:
   a first array of capacitors selectively coupled to the first node of the multivibrator; and
   a second array of capacitors selectively coupled to the second node of the multivibrator.

5. The phase-locked loop circuit of claim 4, wherein the second tuner further includes:
   a first array of switches coupled to the first array of capacitors respectively; and
   a second array of switches coupled to the second array of capacitors respectively,
   wherein the second control signal controls the first array of switches to selectively couple the first array of capacitors to the first node of the multivibrator, and controls the second array of switches to selectively couple the second array of capacitors to the second node of the multivibrator, to tune the frequency signal.

6. The phase-locked loop circuit of claim 5, wherein the second control signal controls the first and second arrays of switches to selectively couple different numbers of capacitors to the first and second nodes of the multivibrator to tune the frequency signal.

7. The phase-locked loop circuit of claim 6, wherein the second control signal controls the first and second arrays of switches so that zero capacitors are coupled to the first node and more than zero capacitors are coupled to the second node to tune the frequency signal.

8. The phase-locked loop of claim 5, wherein the first and second arrays of capacitors are selectively coupled to the first and second nodes of the multivibrator according to an iterative process, wherein a decision time for selective coupling of the capacitors in said first and second arrays is in ascending order from a capacitor controlled by a most significant bit in the first control signal to a capacitor controlled by a least significant bit in the first control signal.

9. The phase-locked loop circuit claim 4, wherein the first tuner includes:
   a first varactor coupled to the first node of the multivibrator through the first array of capacitors; and
   a second varactor coupled to the second node of the multivibrator through the second array of capacitors, wherein the first control signal from the low-pass filter controls the first and second varactors to tune the frequency signal.

10. The phase-locked loop circuit of claim 4, wherein each of the first and second arrays of capacitors includes at least one capacitor.

11. The phase-locked loop circuit of claim 4, wherein the first and second arrays of capacitors are assigned weight values, at least a portion of which are different from one another.

12. The phase-locked loop circuit of claim 11, wherein the first and second arrays of capacitors are assigned redundancy values, at least a portion of which are different from one another.

13. The phase-locked loop circuit of claim 12, wherein the frequency signal is tuned based on the weight and redundancy values assigned to the capacitors which are selectively coupled to the first and second nodes of the multivibrator by the first control signal.

14. The phase-locked loop of claim 1, wherein the first control signal is an analog signal which controls tuning of the first tuning circuit.

15. The phase-locked loop circuit of claim 14, wherein the second control signal is a digital signal which controls tuning of the first tuning circuit.

16. A phase-locked loop circuit, comprising:
   a voltage-controlled oscillator to generate a frequency signal;
   a digital comparator to compare the frequency signal to a reference signal;
   a first controller to generate a first control signal based on a comparator output;
   a first tuning circuit to form a first tuning signal based on the first control signal;
   a bias generator to generate a second control signal; and
   a second tuning circuit to form a second tuning signal based on the second control signal, wherein the first and second tuning signals are used by the voltage-controlled oscillator to tune the frequency signal by different amounts.

17. The phase-locked loop circuit of claim 16, wherein the first tuning signal tunes the frequency signal by a first amount and the second tuning signal tunes the second frequency signal by a second amount which is less than the first amount.

18. The phase-locked loop circuit of claim 16, wherein the voltage-controlled oscillator includes a multivibrator having:
   a first inverter including a first node;
   a second inverter including a second node and being cross-coupled to the first inverter circuit; and
   an inductor coupled between the first and second nodes, wherein the first and second tuning signals charge and discharge the inductor to tune the frequency signal, which is output from one of the first and second nodes.

19. The phase-locked loop circuit of claim 18, wherein the first tuning circuit includes:
   a first array of capacitors selectively coupled to the first node of the multivibrator by the first control signal; and
   a second array of capacitors selectively coupled to the second node of the multivibrator by the first control signal.

20. The phase-locked loop circuit of claim 19, wherein the first tuning circuit includes:
   a first array of switches coupled to the first array of capacitors respectively; and
   a second array of switches coupled to the second array of capacitors respectively,
   wherein the first control signal controls the first array of switches to selectively couple the first array of capacitors to the first node of the multivibrator, and controls the second array of switches to selectively couple the second array of capacitors to the second node of the multivibrator.

21. The phase-locked loop circuit of claim 20, wherein the first control signal controls the first and second arrays of switches to selectively couple different numbers of capacitors to the first and second nodes of the multivibrator.

22. The phase-locked LOOP circuit of claim 21, wherein the first control signal controls the first and second arrays of switches so that zero capacitors are coupled to the first node and more than zero capacitors are coupled to the second node.

23. The phase-locked loop circuit of claim 20, wherein the first control signal controls the first and second arrays of switches to selectively couple a same number of capacitors to the first and second nodes of the multivibrator to tune the frequency signal.

24. The phase-locked loop circuit of claim 20, further comprising:
   an accumulator which estimates a period of the frequency signal,
   wherein said comparator compares the estimated period of the frequency signal to a predetermined reference value to form said comparator output.

25. The phase-locked loop circuit of claim 24, wherein the first controller includes:
   a logic circuit which generates the first control signal as a digital signal based on a comparison of the comparator output to a clock signal corresponding to a count period of the accumulator, wherein the digital control signal is indicative of whether the frequency signal is leading or lagging the reference signal.

26. The phase-locked loop circuit of claim 25, wherein the first control signal includes N bits where each bit controls a respective one of the switches in at least one of the first and second arrays of switches, to selectively couple corresponding capacitors to the first and second nodes of the multivibrator.

27. The phase-locked loop circuit of claim 24, wherein the accumulator estimates the period of the frequency signal by counting a number of oscillations in the frequency signal, said comparator comparing the number of oscillations to a reference number of oscillations indicated by said predetermined reference value.

28. The phase-locked loop circuit of claim 27, further comprising:
   a circuit which masks the frequency signal from the accumulator for a period of time based on first logical value of a count enable signal, wherein the accumulator counts the number of oscillations in the frequency signal when the count enable signal assumes a second logical value.

29. The phase-locked loop circuit of claim 24, further comprising:
   a reset counter which generates a signal for resetting the accumulator during at least one of start-up and when the frequency signal deviates from the reference signal.

30. The phase-locked loop circuit of claim 19, wherein the first and second arrays of capacitors are assigned weight values.

31. The phase-locked loop circuit of claim 30, wherein the first and second arrays of capacitors are assigned redundancy values.

32. The phase-locked loop circuit of claim 31, wherein the frequency signal is tuned based on the weight and redundancy values assigned to the capacitors which are selectively coupled to the first and second nodes of the multivibrator by the first control signal.

33. The phase-locked loop of claim 19, wherein the first and second arrays of capacitors are selectively coupled to the first and second nodes of the multivibrator according to an iterative process, wherein a decision time for selective coupling of the capacitors in said first and second arrays is in ascending order from a capacitor controlled by a most significant bit in the first control signal to a capacitor controlled by a least significant bit in the first control signal.

34. The phase-locked loop circuit claim 19, wherein the second tuning circuit includes:
   a first varactor coupled to the first node of the multivibrator through the first array of capacitors; and
   a second varactor coupled to the second node of the multivibrator through the second array of capacitors, wherein the first control signal from the low-pass filter controls the first and second varactors to tune the frequency signal.

35. The phase-locked loop circuit of claim 34, wherein each of the first and second arrays of capacitors includes at least one capacitor.

36. The phase-locked loop circuit of claim 16, wherein the first tuning signal tunes the frequency signal while the second tuning signal is held at a fixed value.

37. A phase-locked loop circuit, comprising:
   a voltage-controlled oscillator (VCO) to generate a frequency signal;
   a first tuning circuit to tune the frequency signal by a first amount;
   a second tuning circuit to tune the frequency signal by a second amount that is less than said first amount; and
   a control circuit to control the first and second tuning circuits to tune the frequency signal by said first and second amounts, wherein the first tuning circuit comprises,
      a first array of capacitors selectively coupled to a first node of the VCO, and
      a second array of capacitors selectively coupled to a second node of the VCO to output the frequency signal tuned by the first and second tuning circuits.

38. The phase-locked loop circuit of claim 37, wherein the first and second arrays of capacitors are assigned weight values, at least a portion of which are different from one another.

39. The phase-locked loop circuit claim 38, wherein the second tuning circuit includes:
a first varactor coupled to the first node of the VCO through the first array of capacitor; and
a second varactor coupled to the second node of the VCO through the second array of capacitors, wherein a second control signal is configured to control the first and second varactors to tune the frequency signal.

40. The phase-locked loop circuit of claim 37, wherein the first and second arrays of capacitors are assigned redundancy values, at least a portion of which are different from one another.

41. The phase-locked loop circuit claim 40, wherein the second tuning circuit includes:
a first varactor coupled to the first node of the VCO through the first array of capacitors; and
a second varactor coupled to the second node of the VCO through the second array of capacitors, wherein a second control signal is configured to control the first and second varactors to tune the frequency signal.

42. The phase-locked loop circuit of claim 37, wherein the first and second arrays of capacitors are assigned weight values, at least a portion of which are different from one another, wherein the first and second arrays of capacitors are assigned redundancy values, at least a portion of which are different from one another, and wherein the frequency signal is tuned based on the weight and redundancy values assigned to the capacitors that are selectively coupled to the first and second nodes.

43. The phase-locked loop of claim 37, wherein the first and second arrays of capacitors are selectively coupled to the first and second nodes of a multivibrator of the VCO according to an iterative process, wherein a decision time for selective coupling of the capacitors in said first and second arrays is in ascending order from a capacitor controlled by a most significant bit in a first control signal to a capacitor controlled by a least significant bit in the first control signal.

44. The phase-locked loop of claim 43, comprising:
a digital comparator to compare die frequency signal to a reference signal, wherein the control circuit generates the first control signal based on a comparator output.

45. The phase-locked loop of claim 37, wherein the control circuit controls the first and second arrays of capacitors to selectively couple different numbers of capacitors to the first and second nodes of the VCO to tune the frequency signal.

46. The phase-locked loop of claim 37, wherein the control circuit controls the first and second arrays of capacitors so that zero capacitors are coupled to the first node and more than zero capacitors are coupled to the second node to tune the frequency signal.

47. The phase-locked loop of claim 46, comprising:
a digital comparator to compare the frequency signal to a reference signal, wherein the first controller generates a first control signal based on a comparator output, wherein the VCO comprises an inductor connected between the first and second nodes.

48. The phase-locked loop of claim 37, wherein the control circuit includes:
a first controller to control tuning by the first tuning circuit; and
a second controller to control tuning by the second tuning circuit,
wherein the first and second controllers generate independent control signals to control the first and second tuning circuits respectively, to tune the frequency signal by said first and second amounts.

* * * * *